(12) United States Patent
Moyer et al.

(10) Patent No.: US 6,620,720 B1
(45) Date of Patent: Sep. 16, 2003

(54) INTERCONNECTIONS TO COPPER IC'S

(75) Inventors: Ralph Salvatore Moyer, Mohnton, PA (US); Vivian Wanda Ryan, Washington, NJ (US)

(73) Assignee: Agere Systems INC, Allentown, PA (US)

( * ) Notice: Subject to any disclaimer, the term of this patent is extended or adjusted under 35 U.S.C. 154(b) by 0 days.

(21) Appl. No.: 09/546,037

(22) Filed: Apr. 10, 2000

(51) Int. Cl.⁷ ................................................ H01L 21/44
(52) U.S. Cl. ...................... 438/612; 438/613; 438/614; 438/652; 438/653; 438/656
(58) Field of Search ................... 438/614, 612, 438/656, 652, 653, 613

(56) References Cited

U.S. PATENT DOCUMENTS

| | | | | |
|---|---|---|---|---|
| 5,169,680 A | * | 12/1992 | Ting et al. | 438/629 |
| 5,420,073 A | * | 5/1995 | DiGiacomo et al. | 427/96 |
| 5,508,229 A | * | 4/1996 | Baker | 438/614 |
| 5,959,359 A | * | 9/1999 | Tsuchiya | 257/766 |
| 6,187,680 B1 | * | 2/2001 | Costrini et al. | 438/688 |
| 6,281,106 B1 | * | 8/2001 | Higdon et al. | 438/613 |
| 6,287,893 B1 | * | 9/2001 | Elenius et al. | 438/108 |

* cited by examiner

*Primary Examiner*—Amir Zarabian
*Assistant Examiner*—Christy Novacek
(74) *Attorney, Agent, or Firm*—Peter V. D. Wilde

(57) ABSTRACT

The specification describes a process for forming a barrier layer on copper metallization in semiconductor integrated circuits. The barrier layer is effective for both wire bond and solder bump interconnections. The barrier layer is Ti/Ni formed on the copper. Aluminum bond pads are formed on the barrier layer for wire bond interconnections and copper bond pads are formed on the barrier layer for solder bump interconnections.

16 Claims, 2 Drawing Sheets

INTERCONNECTIONS TO COPPER IC'S

FIELD OF THE INVENTION

This invention relates to integrated circuit packages with copper metallization and wire bond or solder bump bond interconnections.

BACKGROUND OF THE INVENTION

Wire bonding has been used in integrated circuit packaging since the inception of IC technology. Wire bonding techniques and wire bonding machines have been refined to the point where wire bonds are relatively inexpensive and are highly reliable. However, wire bonds are rapidly being replaced by more advanced packaging approaches, partly because wire bonds require greater pitch than is available in many state of the art packages.

Among the common IC interconnection methods is flip-chip bonding where high pin count IC chips are flip-chip bonded to a printed wiring board or where the IC chip is flip-chip bonded to a silicon intermediate interconnect substrate, and the silicon intermediate interconnect substrate is in turn ball bonded or flip-chip bonded to a printed wiring board. In many cases these packages use recessed chip arrangements to reduce the package profile.

In these advanced packaging approaches, interconnection pitches can be very small. The earlier technology of wire bonding is being replaced for many applications where the high density of I/O's in current IC chips presents a challenge to the capacity of wire bond techniques. However, due to the high I/O density of state of the art IC chips, packaging yield using advanced packaging techniques may suffer, and the complexity of the packaging process is increased. As a result the overall cost per bond may be relatively high. The low cost and high reliability of wire bonds makes them attractive if ways can be found to adapt wire bonding to packaging high density I/O chips.

Interconnection technology faces a new challenge with the introduction of copper metallization in semiconductor IC devices. Copper has long been an attractive candidate as an interconnection material because of its low cost and high conductivity. However, copper is electrochemically active, and migrates in an electrical environment. It also forms undesirable alloys with common materials used in ICs. These assumed drawbacks have limited the introduction of copper metallization in IC manufacture. However, the conductivity advantage that copper presents is so compelling in state of the art high frequency devices that copper has new impetus as a replacement for aluminum in IC chip interconnections.

With the replacement of aluminum with copper, particularly at the last interconnect level which interfaces the chip to the next board level interconnection, new considerations for interconnection arise. Whereas with aluminum chip interconnections, wire bonding was highly developed and relatively straightforward, solder bump bonding to aluminum was not. Solder bump bonding required special under bump metallization (UBM) for the aluminum pads due to the difficulty in soldering directly to aluminum. With copper replacing aluminum, the situation is somewhat reversed. In principal, from a soldering standpoint, solder bump bonds can be made directly to the top copper metallization level. However, it has been recognized that solder bump bonding directly to copper IC chip metallization does not overcome the copper migration problem. Thus, effective UBM technologies for solder bumps on copper metallization are sought. The primary function of this UBM, in contrast to the UBM used on aluminum metallization, is to form a barrier against copper migration.

In addition, the introduction of copper metallization in state of the art IC production requires new approaches to wire bonding. The straightforward solution is to form aluminum wire bonds pads directly on the top copper metallization level. But again, this approach fails to control the problem of copper migration.

Since, as indicated above, it continues to be desirable to use both wire bond interconnections and solder bump interconnections with the new technology of copper metallized IC devices, it would be useful to develop a solution to the copper migration problem that is compatible with, and effective for, both interconnect strategies.

STATEMENT OF THE INVENTION

We have developed an interconnection metallurgy that can be used effectively for both wire bonding and solder bump bonding to copper metallization. It relies on primarily on an initial Ti/Ni stack over the copper surface. For wire bonding applications, an aluminum layer is deposited on the Ni layer forming a Ti/Ni/Al stack. For solder bump bonding, a copper layer is deposited on the Ni layer forming a Ti/Ni/Cu stack. An advantageous strategy is to process all wafers with an initial Ti/Ni stack. Wafers that are to be wire bonded are processed using an aluminum target for the last sputtered layer, and wafers that are to be solder bump bonded are processed using a copper target for the last sputtered layer. For some applications, substitution of chromium for titanium as the initial layer in the stack is effective.

BRIEF DESCRIPTION OF THE DRAWING

FIGS. 3A–6A are schematic representations of the IC chip bond pad of FIG. 2 used for wire bond interconnection, and FIGS. 3B–6B are schematic representations of the IC chip bond pad of FIG. 2 used for solder bump interconnection.

DETAILED DESCRIPTION

Figure 1:
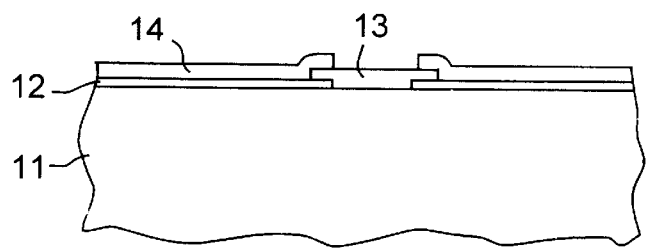
FIGS. 1 and 2 are schematic diagrams of a bond pad of a copper metallized IC chip adapted for either wire bonding or solder bump bonding.

With reference to FIG. 1, a silicon substrate 11 is shown partially cut away to indicate that is a portion of a much larger silicon wafer. It will be understood that these drawings are not to scale, and some features are shown exaggerated for convenience in this exposition. In FIG. 1, deposited dielectric is shown at 12 and copper contact pad at 13. A capping layer of polyimide, or SINCAPS, is shown at 14. The objective is to cover the copper contact pad 13 with a structure that functions in one case as an under bump metallization (UBM) and in the other case a bond pad for a gold wire bond. The layered structure that serves for both applications, which is referred to here as the common composite, is described in connection with FIGS. 2–6. The common composite is formed by evaporating or sputtering multiple layers in the sequence described. Sputtering is generally preferred for this step.

Figure 2:
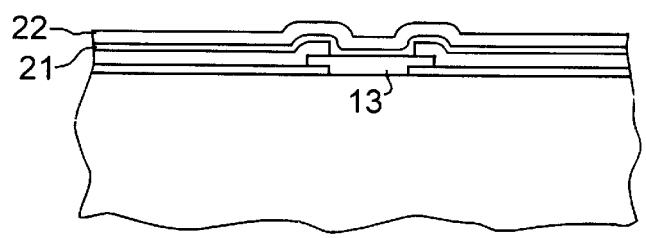

The common composite structure is shown in FIG. 2. In the preferred embodiment, the layers are sputtered in a sputtering apparatus containing multiple targets of the metals of the layers being formed. Sputtering techniques are well known and the details are not necessary for this description. Other techniques for depositing the metal layers, e.g. evaporation or chemical vapor deposition, can also be used.

The first layer 21 is either chromium or titanium with a thickness of the order of 100–1500 Angstroms. Both chromium and titanium adhere well to the copper contact 13 and also adhere to the dielectric layers present in the structure. These materials are also refractory and form a corrosion resistant interface with the copper contact. It is recommended that titanium layers be sputtered at 300–450° C., with a layer thickness in the range 200–500 Angstroms. The relatively high sputtering temperature encourages the formation of a transition layer of Cu-Ti, which improves adhesion and also improves anti-electromigration lifetime. For some applications, notably those that require high temperature processing or burn-in testing, chromium will be preferred because it performs well as an oxygen barrier. It is also preferred to reactively sputter the chromium layer in a nitrogen ambient at 25–300° C. to produce nitrided chromium layer for more effective oxygen barrier characteristics. The recommended thickness of the nitrided chromium layer is in the range 400–1500 Angstroms The second layer 22 is a barrier layer comprising nickel, with a thickness in the range 2000–20,000 Angstroms. Preferably the nickel layer is sputtered and the sputtering target contains 0.5–10% V to facilitate sputtering. This layer may also be doped with 0.5–2.0% chromium, molybdenum, tungsten, tantalum, zirconium, niobium, or boron to provide solid solution strengthening. to Preferably, the layer 22 comprises at least 90% Ni. Sputtering of this layer may be conducted in an apparatus with both nickel and vanadium targets, and a suitable target for any other dopant chosen, or, more typically, may be sputtered from a composite target of, e.g. Ni (7% V). The former alternative gives the option of transitioning between targets to produce variations the composition of the deposited layer with thickness.

The morphology of the deposited layer can also be transitioned with thickness by varying the temperature during the deposition cycle. For example, if the temperature at the start of deposition is 25° C., and is raised to 300° C. at the end of deposition, the layer deposits with an amorphous structure at the bottom interface, which results in good Ti/Ni interface characteristics, and a crystalline habit at the top of the layer for optimum Ni/Al interface characteristics.

It is preferred that the common composite stack, as well as the top layers described below, be deposited in the same deposition apparatus, without breaking vacuum. This expedient makes practical another optional stack structure according to the invention. This option, which provides especially effective barrier properties, is to alternate Ti/Ni layers, producing, e.g. Ti/Ni/Ti/Ni. These alternate layers may be multiplied as desired.

The composition of the last layer of the stack depends on the interconnection technique to be used. For wafers to be wire bonded, the top layer is aluminum, with a thickness, e.g., of 1–2 microns, and deposited preferably at 25–200° C. This aluminum layer may be doped with 0.5–2.0% copper. For solder bump sites, the last layer is 0.5–1.0 microns of copper.

These alternatives are illustrated in FIGS. 3A–3B to 6A–6B where the wire bond sites are shown in the figures designated 3A–6A and the solder bump sites are shown in the figures designated 3B–6B.

Figure 3A:
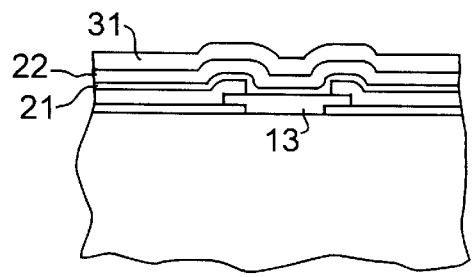
Figure 3B:
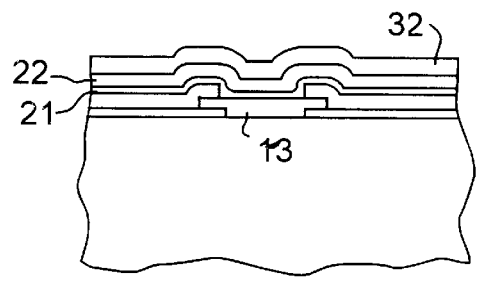

With reference to FIG. 3A, the last or top layer in the multilayer stack is an aluminum layer 31. The aluminum layer can be wire bonded with conventional gold wires. With reference to FIG. 3B, the top layer in the multilayer stack is a copper layer 32. The copper layer is wettable with solder materials commonly used for the solder bumps. The melting point of most copper eutectics with tin solders is relatively low, and at the soldering temperature the surface of the copper layer dissolves in the solder bump forming a physically and electrically sound bond. The copper layer 32 may be provided with an optional layer of gold applied to the surface of the copper layer to inhibit oxidation of the copper surface. The optional gold layer may have a thickness of 200–2000 Angstroms, and preferably 200–1000 Angstroms.

Figure 4A:
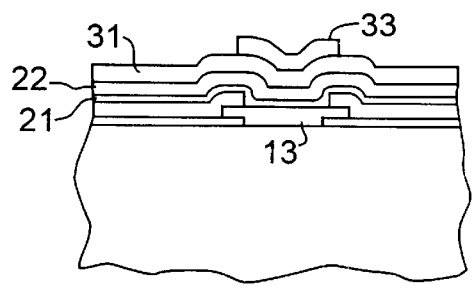
Figure 4B:
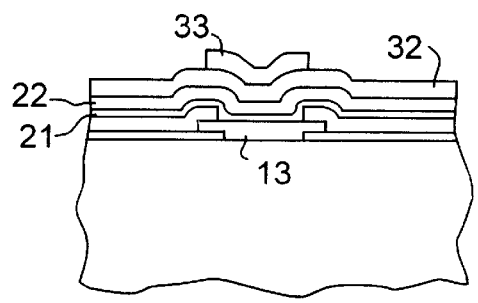

With deposition of the multilayer stacks completed, the bond sites are masked with an etch mask 33, as shown in FIGS. 4A and 4B. The etch mask is preferably a conventional photoresist and is formed by spinning photoresist on the surface layer and patterning the photoresist with suitable actinic radiation. Alternative masking techniques can be used such as e.g. an oxide hardmask.

The stack structures are then defined by conventional etching, e.g. wet etching or RIE. The gold layer, if present, and the copper layer 32 are etched using conventional etchant solutions. Gold etchants include potassium cyanide/ferricyanide solutions, iodide/iodine solutions, and aqua regia. Copper is etched with, e.g., iron chloride, or a mixture of sulfuric acid and potassium chromate.

The aluminum layer 31 can be etched using KOH or other suitable etchant. The nickel layer 22 can be etched using HCl. The titanium layer 21 can be etched with buffered HF. If layer 21 is chromium, it can be etched using a basic chromium etch solution of sodium hydroxide and potassium ferricyanide.

Figure 5A:
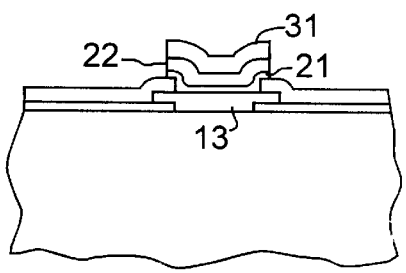
Figure 5B:
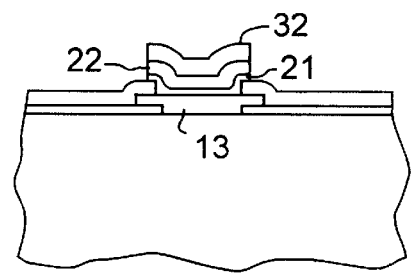
Figure 6A:
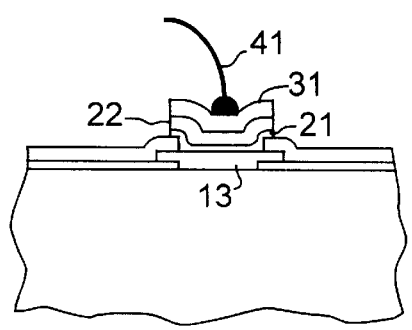

The structures, after etching the multilayers and removal of the etch mask, are shown in FIGS. 5A and 5B. The bond site to be wire bonded, i.e. 31, is shown in FIG. 6A with gold wire bond 41 attached. The wire is preferably gold, or a gold alloy with small amounts of metal additives, such as Au—Be, for hardening etc.

The diameter of the wire is typically 0.5–2 mils, and preferably 1–1.2 mils. The area of the aluminum bond pads is typically in the range 1000–40000 $\mu m^2$ and preferably 5000–25000 $\mu m^2$. The wire bonding step is a conventional thermocompression operation using bonding using tools widely available in the technology. The bond force may be 15–60 grams, preferably 40–60 grams. The ultrasonic frequency is in the range 40–200 kHz, preferably 60–120 kHz, and the power in the range 20–200 mW, preferably 50–100 mW. These parameters are suitable for a variety of bonding tools including, e.g. K & S wire bonders.

Figure 6B:
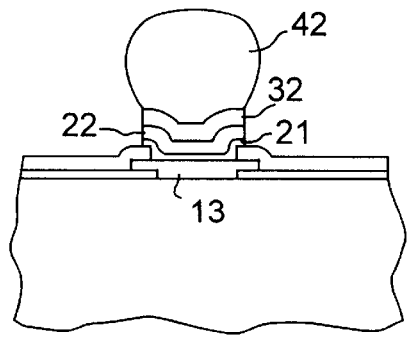

The solder bond site 32 is shown with solder bump 42 in FIG. 6B. This illustration is schematic with the mating surface on the interconnect substrate not shown. The solder bump is formed by any suitable technique such as solder paste, or evaporation. The latter is typically compatible with high lead content solders, e.g. 95 PbSn. The solder bump may also be formed by electroplating using e.g. the bottom layer of the composite as the cathode. For this sequence the three layer stack is deposited as described above, and the solder bump sites masked. The top layer or layers may be removed leaving the Ti or Cr layer for the cathode. The bottom layer is masked to localize the electrolytic plating process to the solder bump sites. After plating and solder reflow the bottom layer is patterned. High tin or silver based solders are suited for this approach. Alternatively, these solders may be applied by electroless plating.

The thickness of a typical solder bump is 1–10 mils. Examples of solder compositions that can be used successfully in the processes described above here:

|    | I  | II | III | IV   |
|----|----|----|-----|------|
| Sn | 5  | 63 | 95  | 3.5  |
| Pb | 95 | 37 | 0   | 0    |
| Sb | 0  | 0  | 5   | 0    |
| Ag | 0  | 0  | 0   | 96.5 |

The processes described above were developed for silicon CMOS integrated circuits but can apply equally to other kinds of semiconductor integrated circuits such as III–V photonic integrated circuits. These integrated circuits typically have GaAs or InP substrates and multilevels of III–V ternary and/or quaternary layers forming the active devices. However, the interconnections can in some applications be similar to those used in silicon IC technology. These circuits also typically operate at very high speeds where copper metallization is distinctly advantageous.

Most silicon integrated circuits manufactured today have polysilicon gates for the transistor devices, and the first level metal is typically polysilicon to form the gates and form interconnections for those gates. The metal interconnect levels formed after the first level are usually aluminum, and one to three aluminum levels are typical. Of these one or more, will be substituted with copper as described above.

The processes described above contemplate the use processing of individual wafers for either wire bonding or solder bump bonding. The invention is also applicable to wafers that are both wire bonded and solder bump bonded. In the case a single wafer is processed to have both the wire bond pad of the invention and the solder bump bond. This is achieved most conveniently by processing the wafer, as described above, to have the first and second layers, i.e. the titanium/chromium layer, and the layer comprising nickel, then selectively depositing copper on the solder bond sites, and selectively depositing aluminum on the wire bond sites. It will be understood that the latter two steps can be done in either sequence. The selective deposition step may be accomplished by standard lithography using a subtractive (mask and etch) method, or preferably an additive (lift-off) method. These layers can be deposited on the bond sites specifically, or over blanket regions containing the bond sites. This approach illustrates profoundly the versatility of having a common composite to solve the copper migration problem for both interconnection strategies.

This common composite barrier layer is also useful for gold metallization. Gold is widely used as an interconnect material in photonic integrated circuits. The versatility offered by having a common under bump metallization for a variety of applications will be apparent to those skilled in the art.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of a semiconductor integrated circuit, the integrated circuit having a plurality of copper contacts, the method comprising:
   (a) depositing a first layer on the plurality of copper contacts, the first layer being of a material selected from the group consisting of titanium and chromium,
   (b) depositing a second layer comprising nickel on the first layer,
   (c) depositing a third layer comprising aluminum on the second layer,
   (d) etching the first, second, and third layers to form a bond pad, and
   (e) bonding a conductive wire interconnection to the third layer.

2. The method of claim 1 wherein the semiconductor of the semiconductor integrated circuit is silicon.

3. The method of claim 2 wherein the wire comprises gold and is bonded using thermocompression bonding.

4. The method of claim 1 comprising the additional steps, prior to step (a), of depositing a capping layer on said copper contacts, forming windows in said capping layer, and proceeding with steps (a) through (c).

5. The method of claim 1 wherein the first, second and third layers are sequentially sputtered in the same sputtering apparatus without breaking vacuum.

6. The method of claim 1 wherein the nickel layer comprises nickel with 0.5–10% vanadium.

7. The method of claim 1 wherein the first layer comprises chromium and is deposited by sputtering in a nitrogen atmosphere.

8. A method for the manufacture of a semiconductor integrated circuit the integrated circuit having a plurality of copper contacts, the method comprising:
   (a) depositing a first layer on the plurality of copper contacts, the first layer being of a material selected from the group consisting of titanium and chromium,
   (b) depositing a second layer comprising nickel on the first layer,
   (c) depositing a third layer comprising copper on the second layer,
   (d) etching the first, second, and third layers to form a bond pad, and
   (e) bonding a solder bump interconnection to the third layer.

9. The method of claim 8 wherein the semiconductor of the semiconductor integrated circuit is silicon.

10. The method of claim 8 wherein the first, second and third layers are sequentially sputtered in the same sputtering apparatus without breaking vacuum.

11. The method of claim 8 wherein the nickel layer comprises nickel with 0.5–10% vanadium.

12. A method for the manufacture of semiconductor integrated circuits comprising the steps of:
   (a) forming a plurality of copper contacts on a semiconductor substrate,
   (b) depositing a dielectric layer on said copper contacts,
   (c) forming a plurality of openings in said dielectric layer to leave exposed portions of said copper contacts,
   (d) sputtering a first layer on the dielectric layer and on the exposed portions of the copper contacts, the first layer comprising a 100–1500 Angstrom titanium layer,
   (e) sputtering a second layer on the first layer, the second layer comprising a 2000–20,000 Angstrom layer of a nickel/lvanadium alloy,
   (f) sputtering a third layer on the second layer, the third layer comprising an approximately 1–2 micron layer of aluminum,
   (g) etching away selected portions of said first, second and third layers to leave a bond pad, and
   (h) thermocompression bonding a conductive wire to said bond pad.

13. The method of claim 12 wherein the first layer is sputtered at a temperature in the range 300–450° C., the second layer is sputtered at a temperature in the range 25–300° C., and the third layer is sputtered at a temperature in the range 25–200° C.

14. A method for the manufacture of a semiconductor integrated circuit wherein the semiconductor integrated circuit has a top metallization level and is provided with wire bond interconnection sites and solder bump interconnection sites the method comprising:

(a) depositing a first layer on selected portions of the top metallization level, the first layer being of a material selected from the group consisting of titanium and chromium, (b) depositing a second layer comprising nickel on the first layer, (c) selectively depositing a first contact layer comprising aluminum on the wire bond sites, (d) selectively depositing a second contact layer comprising copper on the solder bump sites, (e) etching the first, second, and first and second contact layers to form wire bond pads and solder bump pads, (f) bonding conductive wire interconnections to the wire bond sites, and (g) bonding solder bump interconnections to the solder bump sites.

15. The method of claim 14 wherein the top interconnection level of the semiconductor integrated circuit comprises copper.

16. A method for the manufacture of a plurality of semiconductor integrated circuit wafers wherein a first group of the plurality is provided with wire bond interconnection sites and a second group of the plurality is provided with solder bump interconnection sites, and wherein the plurality of wafers have copper contacts, the method comprising processing the plurality of semiconductor wafers by the steps of:

(a) depositing a first layer on selected portions of the copper contacts, the first layer being of a material selected from the group consisting of titanium and chromium, (b) depositing a second layer comprising nickel on the first layer, (c) separating the plurality of wafers into a first group and a second group, (d) depositing a first contact layer comprising aluminum on the wire bond sites of the first group, (e) depositing a second contact layer comprising copper on the solder bump sites of the second group, (f) bonding conductive wire interconnections to the wire bond sites of the first group, and (g) bonding solder bump interconnections to the solder bump sites of the second group.

* * * * *